United States Patent
Ueda et al.

(10) Patent No.: US 7,619,316 B2
(45) Date of Patent: Nov. 17, 2009

(54) SEMICONDUCTOR PACKAGE AND METHOD FOR MANUFACTURING THE SAME

(75) Inventors: Keisuke Ueda, Nagano (JP); Takaharu Miyamoto, Nagano (JP); Ryuichi Matsuki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 1 day.

(21) Appl. No.: 11/976,825

(22) Filed: Oct. 29, 2007

(65) Prior Publication Data
US 2008/0128915 A1    Jun. 5, 2008

(30) Foreign Application Priority Data
Oct. 30, 2006    (JP) .......................... P.2006-293801

(51) Int. Cl.
*H01L 22/48* (2006.01)
*H01L 23/52* (2006.01)
*H01L 29/40* (2006.01)

(52) U.S. Cl. .................. 257/777; 257/700; 257/701; 361/760; 361/765

(58) Field of Classification Search ......... 257/700–704, 257/777–778; 361/760, 765, 795
See application file for complete search history.

(56) References Cited

U.S. PATENT DOCUMENTS

| | | | | |
|---|---|---|---|---|
| 7,307,852 B2 * | 12/2007 | Inagaki et al. | ............... | 361/760 |
| 7,462,784 B2 * | 12/2008 | Kariya et al. | ............... | 174/260 |
| 2005/0029658 A1 * | 2/2005 | Sugiyama et al. | ........... | 257/747 |
| 2006/0175083 A1 * | 8/2006 | Muramatsu et al. | ......... | 174/260 |

FOREIGN PATENT DOCUMENTS

JP    2001-007250    1/2001

* cited by examiner

*Primary Examiner*—Phuc T Dang
(74) *Attorney, Agent, or Firm*—Drinker Biddle & Reath LLP

(57) ABSTRACT

A semiconductor package includes: a build-up wiring layer including a metal wiring layer and an insulation resin layer; and a low thermal expansion material layer having a coefficient of thermal expansion closer to that of a semiconductor chip mounted on the build-up wiring layer as compared with the insulation resin layer of the build-up wiring layer, the low thermal expansion material layer being bonded to an entire region of a rear surface of the build-up wiring layer corresponding to a region of a front surface of the build-up wiring layer on which the semiconductor chip is mounted.

7 Claims, 5 Drawing Sheets

SEMICONDUCTOR PACKAGE AND METHOD FOR MANUFACTURING THE SAME

This application is based on and claims priority from Japanese Patent Application No. 2006-293801, filed on Oct. 30, 2006, the entire contents of which are hereby incorporated by reference.

BACKGROUND OF THE INVENTION

1. Technical Field

The present disclosure relates to a semiconductor package capable of being reduced in difference in thermal expansion with a semiconductor chip to be mounted, and improving the life of a semiconductor device, and a method for manufacturing the same.

2. Related Art

Currently, dominant semiconductor packages of CPUs or MPUs are plastic laminate packages. Particularly, with regard to a build-up structure in which on both sides of a core substrate including a glass cloth serving as a base material, metal wiring layers and insulation layers are repeatedly provided to form wirings or the like, technological innovation is accelerating. However, the difference in coefficient of thermal expansion (CTE) between Si of a semiconductor chip and a plastic package unfavorably results in the reduction of the connection reliability due to the stress concentration at the C4 connection part.

Specifically, the plastic package includes an organic material (resin), a glass cloth and a metal wire, and has a coefficient of thermal expansion of about 10 to 25 ppm/° C. In contrast, the silicon chip has a coefficient of thermal expansion of about 3 ppm/° C., and thus it is largely different in thermal expansion from the package. The reliability standards, which have been satisfied in the conventional chip size, package size, and design rule, may become impossible to satisfy the future design rule, chip size, trend for thinner layer. This conceivably causes chip cracking, cracking or peeling of the C4 connection part, breakage of an intrachip wiring layer (ILD), breakage of wirings in the package, or the like.

As the countermeasure, the following technique is proposed. That is, by employing a low elasticity structure (e.g., a coreless package) configured by eliminating the core serving as a base material, and taking out only the build-up layer, the stress occurring in the intrachip dielectric layer (ILD) due to thermal expansion of the package is controlled small. However, problems due to the low elasticity such as occurrence of the stress concentration to the connection part or wirings in the package, and occurrence of warp of the package cannot be prevented from newly occurring.

Conceivably, the thermal expansion of the semiconductor package may be reduced, and be made closer to the thermal expansion of the semiconductor chip. However, this also has a limitation for the combination of a glass cloth impregnated with a resin.

Further, in Japanese Unexamined Patent Document: JP-A-2001-7250 (FIG. 8), there is disclosed a structure in which a build-up layer is formed on a ceramic substrate. In the structure, it is expected that the thermal expansion of the build-up layer can be controlled small because of the low thermal expansion and high rigidity of the ceramic substrate. However, a ceramic substrate is necessarily required to be used and the structure cannot be applied to other substrates or coreless packages. Thus, it lacks in versatility, and hence it cannot be a general solution.

SUMMARY OF THE INVENTION

Accordingly, exemplary embodiments provide a semiconductor package capable of being reduced in difference in thermal expansion from a semiconductor chip without requiring the use of a specific package substrate, and improving the reliability of a semiconductor device and a method for manufacturing the same.

In order to achieve the foregoing object, according to a first aspect of the present invention, there is provided with a semiconductor package including:

a build-up wiring layer including a metal wiring layer and an insulation resin layer; and a low thermal expansion material layer having a coefficient of thermal expansion closer to that of a semiconductor chip mounted on the build-up wiring layer as compared with the insulation resin layer of the build-up wiring layer, said low thermal expansion material layer being bonded to an entire region of a rear surface of the build-up wiring layer corresponding to a region of a front surface of the build-up wiring layer on which the semiconductor chip is mounted.

According to a second aspect of the present invention, there is provided with a method for manufacturing the semiconductor package, including the steps of:

a) arranging a large number of low thermal expansion material plates with clearances provided thereamong in a grid pattern in a plane;

b) pouring a resin in the clearances, and curing the resin to form an integral underlying plate;

c) stacking the two underlying plates one on another, and fixing only periphery thereof using adhesion or clamps to form an integral multilayered plate;

d) forming build-up wiring layers on both surfaces of the multilayered plate;

e) removing the fixed portion of the periphery of the multilayered plate to provide two semiconductor package collective plates in each of which a large number of semiconductor packages including the build-up wiring layer formed on the underlying plate are integrated with each other through a surrounding resin layer; and f) cutting the resin layer of the semiconductor package collective plate into a large number of individual semiconductor packages.

According to the semiconductor package of the present invention, a low thermal expansion material layer has a coefficient of thermal expansion closer to that of a semiconductor chip mounted on the build-up wiring layer as compared with the insulation resin layer of the build-up wiring layer, and the low thermal expansion material layer is bonded to an entire region of a rear surface of the build-up wiring layer corresponding to a region of a front surface of the build-up wiring layer on which the semiconductor chip is mounted. As a result, thermal expansion of the build-up wiring layer on which the semiconductor chip is mounted is reduced by the low thermal expansion material layer bonded to the rear surface. This reduces the difference in thermal expansion from the mounted semiconductor chip.

According to the method for manufacturing the semiconductor package of the present invention, the method comprises: a) arranging a large number of low thermal expansion material plates with clearances provided thereamong in a grid pattern in a plane; b) pouring a resin in the clearances, and curing the resin to form an integral underlying plate; c) stacking the two underlying plates one on another, and fixing only periphery thereof using adhesion or clamps to form an integral multilayered plate; d) forming build-up wiring layers on both surfaces of the multilayered plate; e) removing the fixed portion of the periphery of the multilayered plate to provide two semiconductor package collective plates in each of which a large number of semiconductor packages including the build-up wiring layer formed on the underlying plate are integrated with each other through a surrounding resin layer. Therefore, warpage will not occur upon forming a build-up wiring on one side of one low thermal expansion material plate. In addition, as compared with the case using a large-sized low thermal expansion material plate, handling and separation into individual pieces can be carried out with more ease.

BRIEF DESCRIPTION OF THE DRAWINGS

FIG. 2A shows a plan view, FIG. 2B shows a cross sectional view, and FIG. 2C shows a partial cross sectional view;

DETAILED DESCRIPTION OF EXEMPLARY EMBODIMENTS

Figure 1A:
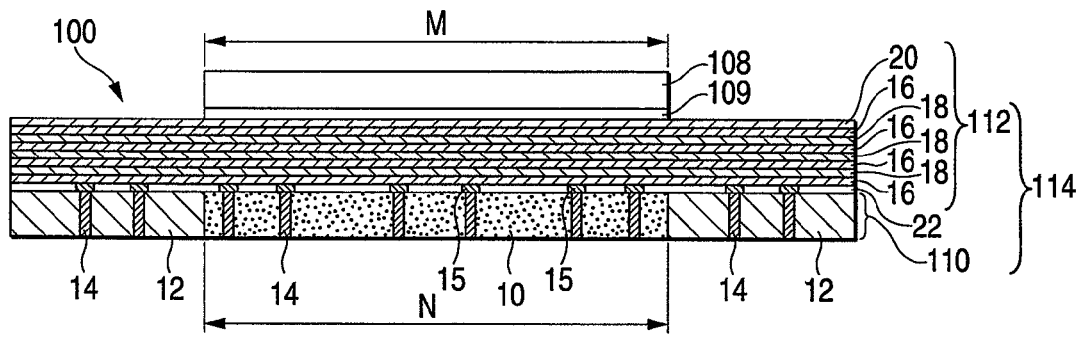
FIGS. 1A to 1D are cross sectional views respectively showing First to Fourth exemplary embodiments of a semiconductor package in accordance with a preferable embodiment of the present invention.

According to one or more exemplary embodiments of a semiconductor package of the present invention, an integral underlying plate that includes the low thermal expansion material layer and a resin layer surrounding the low thermal expansion material layer may be adhered to the entire rear surface of the build-up wiring layer.

According to another exemplary embodiment of the semiconductor package of the present invention, the build-up wiring layer may be directly built up on an integral underlying plate that includes the low thermal expansion material layer and a resin layer surrounding the low thermal expansion material layer.

According to another exemplary embodiment of the semiconductor package of the present invention, the build-up wiring layer may be built-up on an integral underlying plate that includes the low thermal expansion material layer and a resin layer surrounding the low thermal expansion material layer through the insulation resin layer.

As the low thermal expansion material layer, any of silicon, glass, and ceramics may be used. These materials have the following coefficients of thermal expansion.

Examples of material for low thermal expansion material layer for use in the present invention are listed in Table 1.

TABLE 1

| Material | Coefficient of thermal expansion (CTE) |
| --- | --- |
| a) Silicon[1] | 3.4 ppm/° C. |
| b) Glass | 4 to 5 ppm/° C. |
| c) Ceramics | |
| c-1) Alumina | 5 to 7 ppm/° C. |
| c-2) Aluminum nitride | 4.5 ppm/° C. |
| c-3) Barium titanate | 6 ppm/° C. |
| c-4) Titanium oxide | 7 ppm/° C. |

[1]The silicon listed in Table 1 is the same as that used in a semiconductor chip.

The low thermal expansion material layer may be a mere material layer, or may be an electronic component. The electronic component may be a passive component such as a capacitor, a capacitor array, a resistance, or an inductor, or may be an active component such as a semiconductor chip. Further, when the low thermal expansion material layer is formed with a constitution of an electronic component, this may be operated as an electronic component, or may be formed into a dummy as a mere material layer without being operated. In this case, when the low thermal expansion material layer is bonded to a region larger than an entire region of a rear surface of the build-up wiring layer corresponding to a region of a front surface of the build-up wiring layer on which the semiconductor chip is mounted, the rigidity of the entire semiconductor package is increased. This is also very effective for warpage control.

Below, the present invention will be described in more details by way of specific examples.

By reference to FIGS. 1A to 1D, there are shown longitudinal cross sectional views of semiconductor packages of first to fourth exemplary embodiments in accordance with exemplary embodiments of the present invention. However, all views each show the state in which a semiconductor chip is mounted on the semiconductor package of the present invention to form a semiconductor device.

First Exemplary Embodiment

First exemplary embodiment shown in FIG. 1A is configured as follows. On a semiconductor package 114 of the present invention including a build-up wiring layer 112, a semiconductor chip 108 is mounted to form a semiconductor device 100.

A low thermal expansion material layer 10 is bonded to an entire region N of a rear surface of the build-up wiring layer 112 corresponding to a region M of a front surface of the build-up wiring layer 112 on which the semiconductor chip 108 is mounted. As a result, the thermal expansion of the build-up wiring layer 112 within the region M is reduced by the low thermal expansion material layer 10 in the corresponding the region N. This reduces the difference in thermal expansion between the semiconductor chip 108 and the build-up wiring layer 112.

The build-up wiring layer 112 has a structure in which wiring layers 16 made of a metal and insulation layers 18 made of a resin are alternately stacked (four wiring layers 16 in an example of drawings), and a solder resist layer 20 is disposed thereon (via penetrating through the insulation layers 18 and connecting between the wiring layers 16 is not shown).

The low thermal expansion layer 10 has a coefficient of thermal expansion closer to that of the semiconductor chip 108 as compared with the insulation layers 18 of the build-up wiring layer 112.

The semiconductor package 114 of the first exemplary embodiment has the following feature. An integral underlying plate 110 including the low thermal expansion material layer 10 and a resin layer 12 surrounding the low thermal expansion material layer 10 is adhered to the entire rear surface of the build-up wiring layer 112. The low thermal expansion layer 10 and the resin layer 12 are provided with necessary through holes penetrating therethrough. The adhesion is respectively accomplished by a solder 15 for each portions of through hole 14 and an underfill 22 for other portions.

For manufacturing of the semiconductor package 114 of the present exemplary embodiment, the underlying plate 110 and the build-up wiring layer 112 are separately manufactured, and both are attached together.

Second Exemplary Embodiment

Figure 1B:
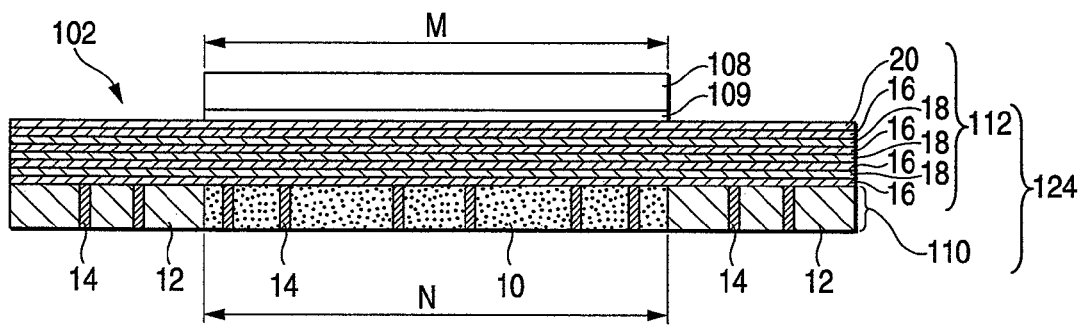

Second exemplary embodiment shown in FIG. 1B is configured as follows. On a semiconductor package 124 of the present invention including a build-up wiring layer 112, a semiconductor chip 108 is mounted to form a semiconductor device 102. The semiconductor package 124 of the second exemplary embodiment is the same structure as the semiconductor package 114 of first exemplary embodiment except for the following features.

Namely, the semiconductor package 124 of second exemplary embodiment has the following feature. On an integral underlying plate 110 including the low thermal expansion material layer 10, and a resin layer 12 surrounding the low thermal expansion material layer 10, a build-up wiring layer 112 is directly build-up formed.

The semiconductor package 124 of the second exemplary embodiment has a smaller number of manufacturing steps compared with the semiconductor package 114 of the first exemplary embodiment, and does not require control of the attachment accuracy, and also does not require a curing step of the solder 15 and an application step of the underfill 22.

The second exemplary embodiment is more advantageous than the first exemplary embodiment also from the viewpoint of a reduction effect of thermal expansion of the build-up wiring layer 112 by the low thermal expansion material layer 10. Namely, as in the first exemplary embodiment, when the solder 15 and the underfill 22 are adhered, the adhered layers (15+22) are interposed between the low thermal expansion layer 10 and the build-up wiring layer 112. Therefore, the reduction effect of thermal expansion of the build-up wiring layer 112 by the low expansion material layer 10 is eased. In this regard, in the second exemplary embodiment, the low thermal expansion material layer 10 is directly bonded to the build-up wiring layer 112. Therefore, such ease of the reduction effect due to the adhered layers (15+22) as in the first exemplary embodiment is not caused. Thus, it is possible to reduce the thermal expansion of the build-up wiring layer 112 effectively.

By reference to FIGS. 2A to 2C and FIGS. 3A to 3E, typical examples of a manufacturing step of the semiconductor package 124 of the second exemplary embodiment will be described below.

Figure 2A:
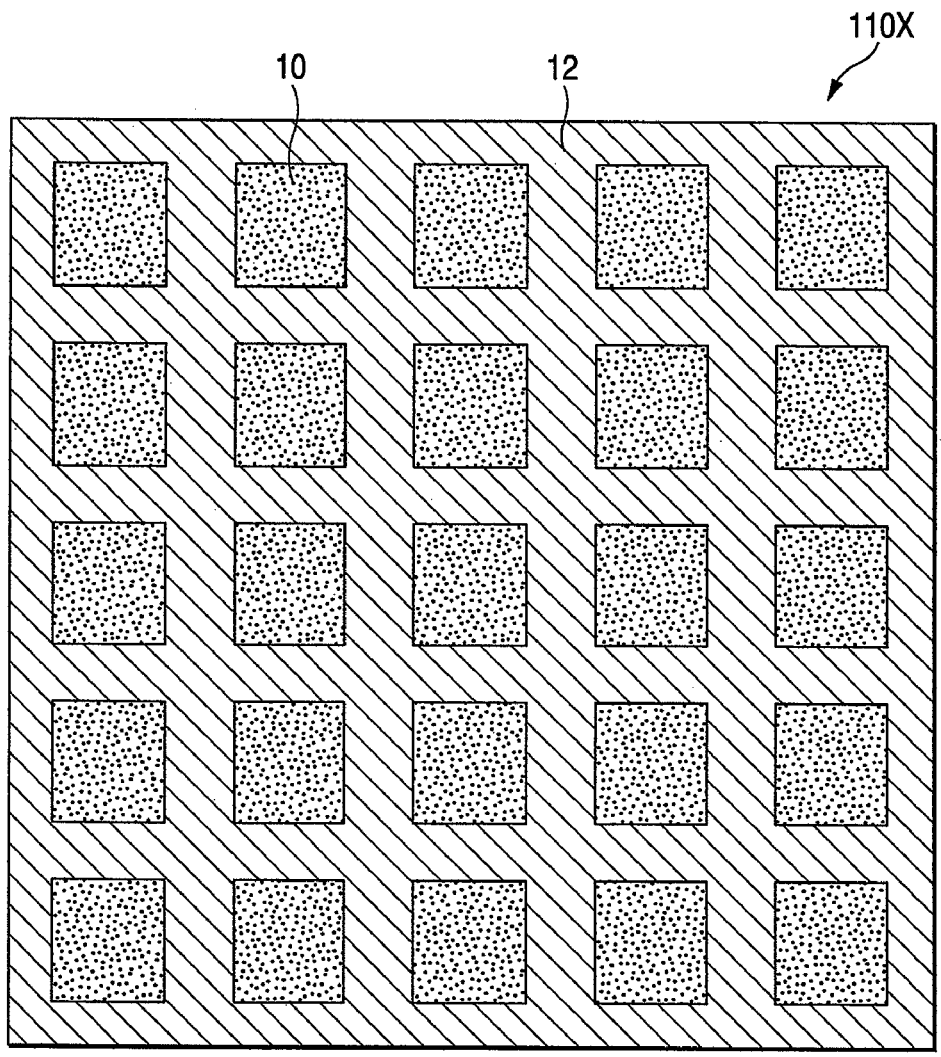
FIGS. 2A to 2C show a step of manufacturing a semiconductor package of Second exemplary embodiment, where
Figure 2B:
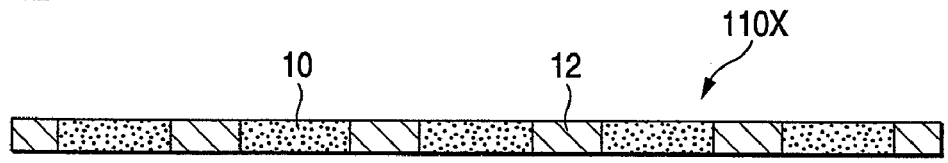

As shown in the plan view of FIG. 2A and the cross sectional view of FIG. 2B, low thermal expansion material pieces 10 for one semiconductor package 124 are arranged with clearances provided thereamong in a grid pattern in a plane. Then, a resin 12 is poured in the clearances, and cured, thereby to form an integral underlying plate 110X. At this step, in order to hold the shape of the underlying plate 110X and to improve the strength thereof, the resin layer 12 may also be formed by impregnating a reinforced fiber (glass fiber, carbon fiber, or aramid fiber), a metal mesh, or the like with a resin.

Figure 2C:
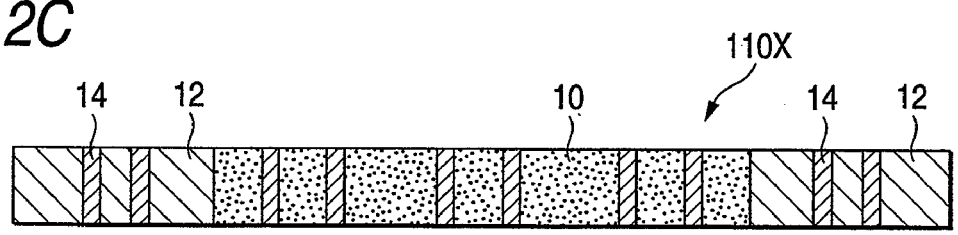

Next, as shown in the partial cross sectional view of the underlying plate 110X of FIG. 2C, through holes 14 are opened by means of a drill, etching, ion etching, or the like at prescribed portions, and each inside thereof is subjected to copper plate, or other processing is carried out. As a result, an electric conduction between the front and the rear of the underlying plate 110 is established.

Figure 3A:
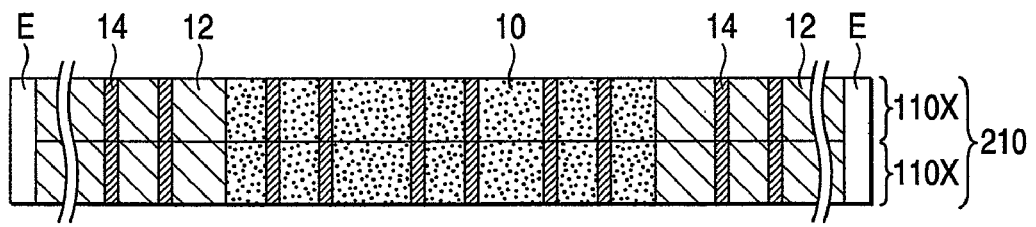
FIGS. 3A to 3E show cross sectional views sequentially showing respective manufacturing steps subsequent to the step of FIGS. 2A to 2C.

Then, as shown in FIG. 3A, two underlying plates 110X are stacked one on another, and only the peripheral portions are fixed by adhesion or clamps (fixed portion E), resulting in an integral multilayered plate 210.

Figure 3B:
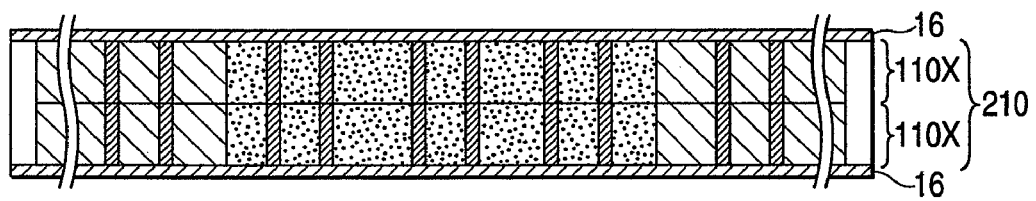
Figure 3C:
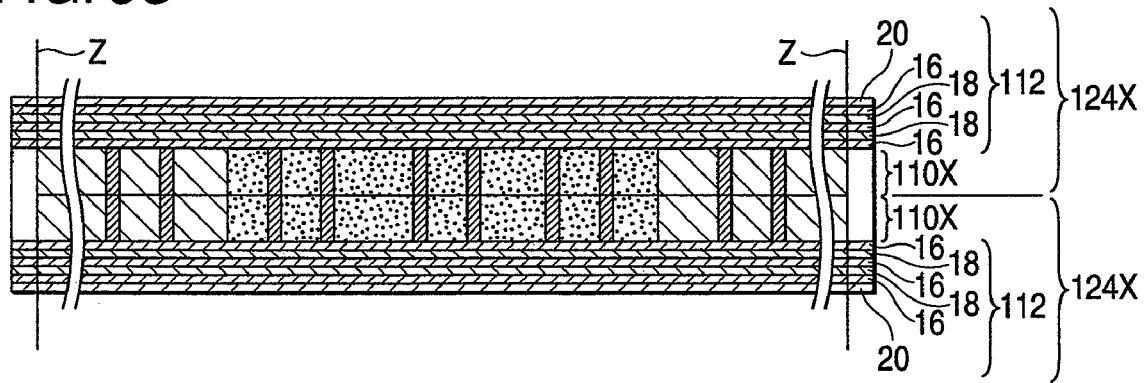

Next, as shown in FIGS. 3B and 3C, on the both sides of the multilayered plate 210, build-up steps are simultaneously carried out and in parallel. Then, wiring layers 16 and insulation layers 18 are alternately stacked. Then, solder resist layers 20 are formed as the uppermost layers, thus to form build-up wiring layers 112, respectively.

Figure 3D:
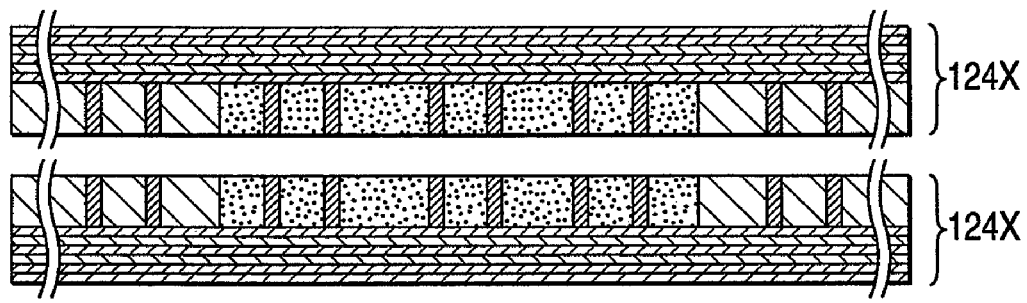

Then, as shown in FIG. 3D, the multilayered plate 210 is cut along line Z shown in FIG. 3C to remove the surrounding fixed portion E. Thus, the multilayered plate 210 is separated into upper and lower two semiconductor package collective bodies 124X in each of which a large number of semiconductor packages are integrated with each other through the surrounding resin layer 12.

Figure 3E:
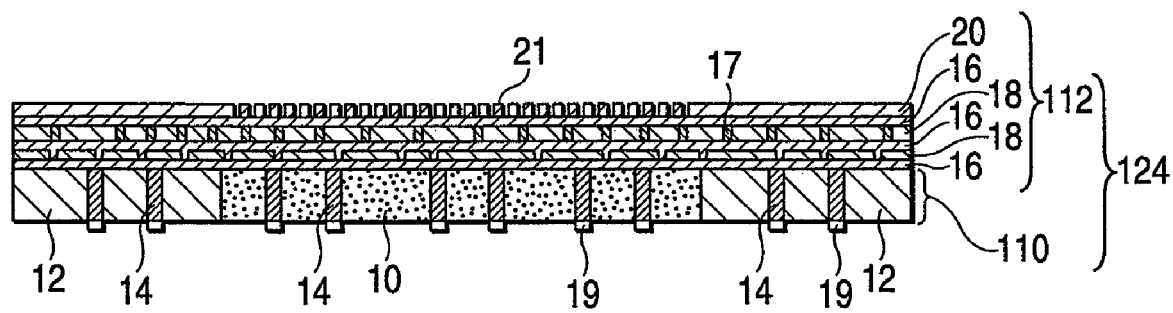

Finally, as shown in details in FIG. 3E, the semiconductor package collective body 124X is cut at the middle portion of width of the resin layer 12 into individual pieces, resulting in each semiconductor package 124. On the solder resist layer 20 which is the uppermost layer of the build-up wiring layer 112, a connection pad 21 used for mounting a semiconductor chip is formed. Within the build-up wiring layer 112, vias 17 penetrating through the insulation layers 18 electrically connects between the upper and lower wiring layers 16. On the lower side of the underlying plate 110, external connection terminals 19 are provided on the lower ends of the through holes 14.

Figure 4:
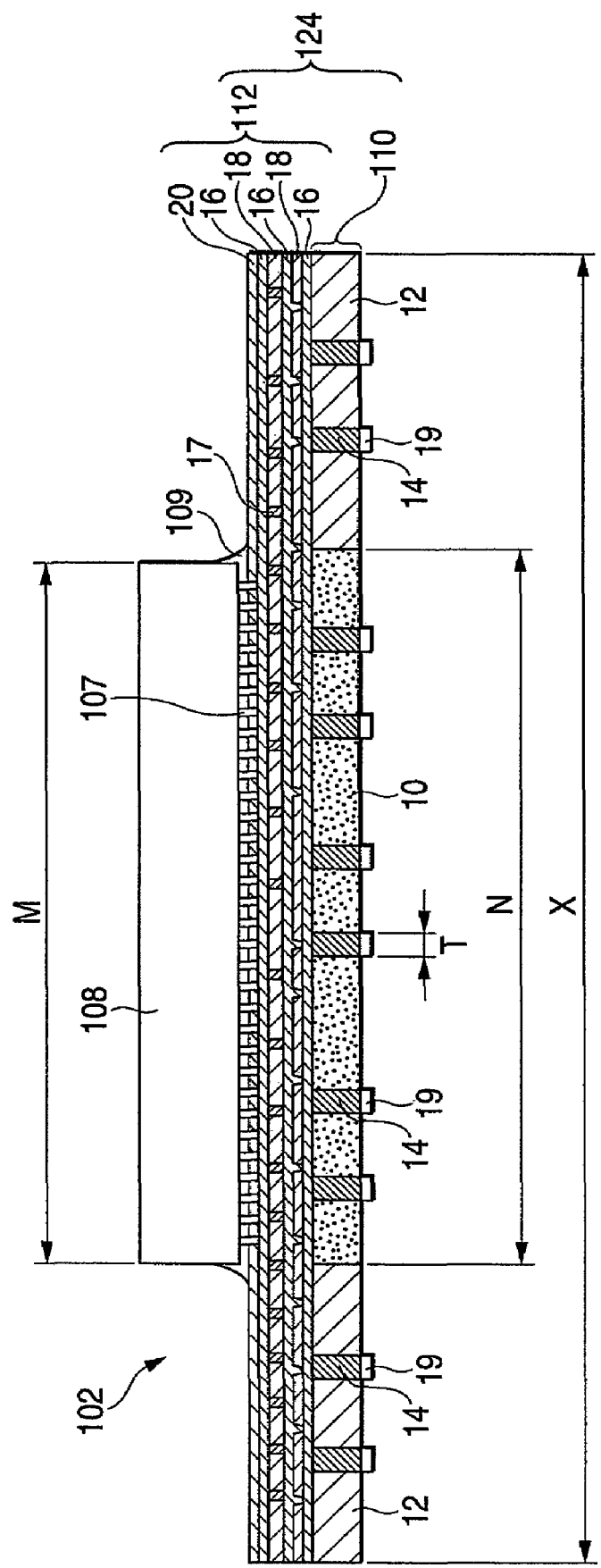
FIG. 4 is a detail view of a semiconductor device including a semiconductor chip mounted on the semiconductor package of a Second exemplary embodiment.

FIG. 4 shows the detail of the semiconductor device 102 including the semiconductor chip 108 mounted on the semiconductor package 124 of FIG. 3E. The semiconductor chip 108 is connected to the connection pad 21 (see, FIG. 3E) on the upper side of the build-up wiring layer 112 through an electrode terminal 107. In the same figure, one examples of the typical dimension and dimensional range of each element are as follows:

Underlying plate 110: thickness 200 μm (5 μm to 5 mm);
Through hole diameter T: 100 μm (10 μm to 5 mm);
Wiring layer 16: thickness 10 μm (3 μm to 300 μm);
Insulation layer 18: thickness 20 μm (3 μm to 300 μm);
Solder resist layer 20: thickness 15 μm (5 μm to 50 μm);
Semiconductor package size X: 50 mm (1 mm to 200 mm);
Semiconductor mounting region size M (=chip size): 25 mm (1 mm to 150 mm); and
Corresponding rear surface region size N: 30 mm (1 mm to 200 mm)

Third Exemplary Embodiment

Figure 1C:
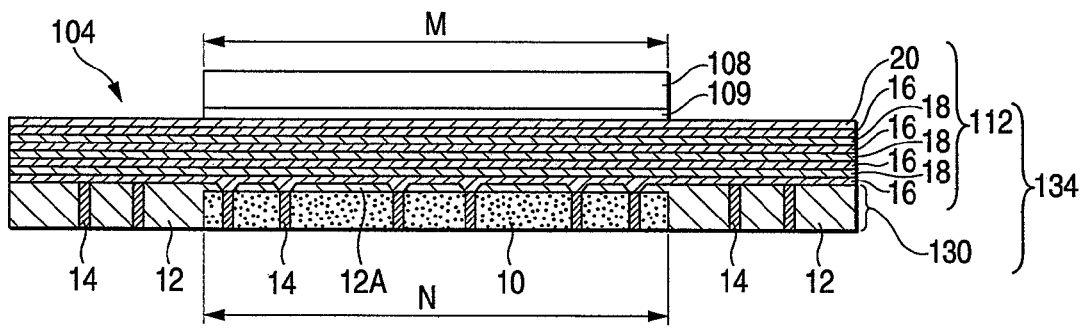

Third exemplary embodiment shown in FIG. 1C is configured as follows. On a semiconductor package 134 of the present invention including a build-up wiring layer 112, a semiconductor chip 108 is mounted to form a semiconductor device 104. The semiconductor package 134 of the third exemplary embodiment has the same structure as the semiconductor package 124 of the second exemplary embodiment except for the following features.

Namely, the semiconductor package 134 of the third exemplary embodiment has the following feature. On an integral underlying plate 130 including the low thermal expansion material layer 10 and a resin layer surrounding the low thermal expansion material layer 10, a build-up wiring layer 112 is build-up formed through an insulation resin layer 12A.

The semiconductor package 134 of the third exemplary embodiment is an effective formation when the insulation of the surface of each electronic component forming the low thermal expansion material layer 10 is difficult. The underlying plate 130 is manufactured in the following manner. For example, when the low thermal expansion material layer 10 is embedded in the resin 12, a resin layer 12A is left without surfacing the upper surface (surface on the build-up wiring layer 112 side). Alternatively, after surfacing, the resin layer 12A is formed by coating or lamination to ensure the insulation of the upper surface. Then, as shown in FIG. 2C, the through holes 14 are formed. Then, the build-up wiring layer 112 is formed by the same step as in the second exemplary embodiment.

Fourth Exemplary Embodiment

Figure 1D:
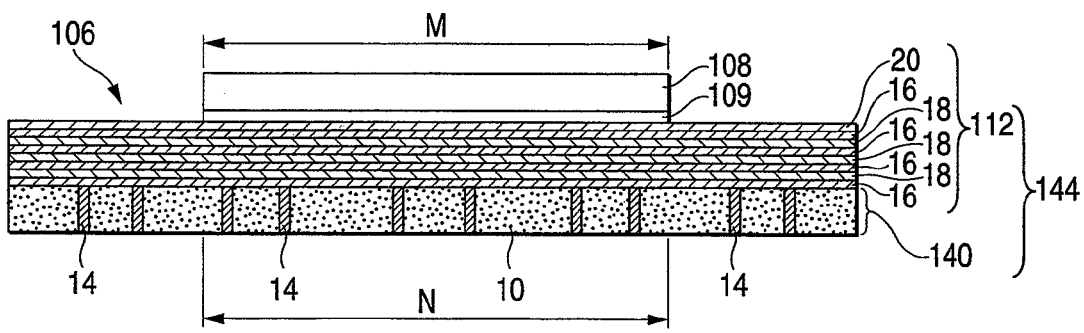

Fourth exemplary embodiment shown in FIG. 1D is configured as follows. On a semiconductor package 144 of the present invention including a build-up wiring layer 112, a semiconductor chip 108 is mounted to form a semiconductor device 106. The semiconductor package 144 of the fourth exemplary embodiment has the same structure as the semiconductor package 124 of the second exemplary embodiment except for the following features.

Namely, the semiconductor package 144 of the fourth exemplary embodiment has the following feature. The low thermal expansion material layer 10 which is an electronic component is bonded to the region of larger than an entire region N of a rear surface of the build-up wiring layer 112 corresponding to a region M of a front surface of the build-up wiring layer 112 on which the semiconductor chip 108 is mounted. As shown in the example of the figure, the entire underlying plate 140 is formed of the low thermal expansion material layer 10 as an electronic component, and bonded to the whole of the build-up wiring layer 112.

For the semiconductor package 144 of the fourth exemplary embodiment, the low thermal expansion material layer 10 forms the entire underlying plate 140 of the semiconductor package 144. Therefore, the reduction effect of the thermal expansion on the build-up wiring layer 112 is still further strong. Further, the low thermal expansion material layer 10 is formed of, typically, silicon, glass, ceramics, or the like. Accordingly, it is high in rigidity, which is also effective for warpage control of the semiconductor package 144. The underlying plate 140 is formed as an electronic component as a whole. However, the following circuit configuration is also acceptable. In the electric circuit of the semiconductor package 144, the whole of the underlying plate 140 is not necessarily required to function as an electronic component, but only the desired portion thereof may function as an electronic component.

For manufacturing the semiconductor package 144, the whole of the low thermal expansion material layer 10 for one semiconductor package 144 is formed as an electronic component. Then, after forming through holes 14, the build-up wiring layer 112 is formed by the same step as in the second exemplary embodiment.

In accordance with the present invention, there are provided a semiconductor package capable of being reduced in difference in thermal expansion from a semiconductor chip without a specific package substrate, and improving the reliability of a semiconductor device and a manufacturing method thereof.

While there has been described in connection with the exemplary embodiments of the present invention, it will be obvious to those skilled in the art that various changes and modification may be made therein without departing from the present invention. It is aimed, therefore, to cover in the appended claim all such changes and modifications as fall within the true spirit and scope of the present invention.

What is claimed is:

1. A semiconductor package comprising:
    a build-up wiring layer including a metal wiring layer and an insulation resin layer; and
    a low thermal expansion material layer having a coefficient of thermal expansion closer to that of a semiconductor chip mounted on the build-up wiring layer as compared with the insulation resin layer of the build-up wiring layer, said low thermal expansion material layer being bonded to an entire region of a rear surface of the build-up wiring layer corresponding to a region of a front surface of the build-up wiring layer on which the semiconductor chip is mounted.

2. The semiconductor package according to claim 1, wherein
    an integral underlying plate that includes the low thermal expansion material layer and a resin layer surrounding the low thermal expansion material layer is adhered to the entire rear surface of the build-up wiring layer.

3. The semiconductor package according to claim 1, wherein
    the build-up wiring layer is directly built up on an integral underlying plate that includes the low thermal expansion material layer and a resin layer surrounding the low thermal expansion material layer.

4. The semiconductor package according to claim 1, wherein
    the build-up wiring layer is built-up on an integral underlying plate that includes the low thermal expansion material layer and a resin layer surrounding the low thermal expansion material layer with the insulation resin layer interposed between the built-up wiring layer and the integral underlying plate.

5. The semiconductor package according to claim 1, wherein
    the low thermal expansion material layer is made of any one of silicon, glass, and ceramics.

6. The semiconductor package according to claim 5, wherein
    the low thermal expansion material layer is an electronic component.

7. The semiconductor package according to claim 6, wherein
    the low thermal expansion material layer is bonded to a region larger than the entire region of the rear surface of the build-up wiring layer.

* * * * *